US 6,639,447 B2
US006639447B2

(12) United States Patent
Manku et al.

(10) Patent No.: US 6,639,447 B2
(45) Date of Patent: Oct. 28, 2003

(54) HIGH LINEARITY GILBERT I Q DUAL MIXER

(75) Inventors: Tajinder Manku, Kitchener (CA); Javad Khajehpour, Waterloo (CA)

(73) Assignee: SiRiFIC Wireless Corporation, Waterloo (CA)

( * ) Notice: Subject to any disclaimer, the term of this patent is extended or adjusted under 35 U.S.C. 154(b) by 0 days.

(21) Appl. No.: 10/094,324

(22) Filed: Mar. 8, 2002

(65) Prior Publication Data

US 2003/0169089 A1 Sep. 11, 2003

(51) Int. Cl.[7] .................................................. G06F 7/44
(52) U.S. Cl. ........................................ 327/359; 455/326
(58) Field of Search .................................. 327/355, 359, 327/356, 361, 362; 455/326

(56) References Cited

U.S. PATENT DOCUMENTS 3,805,162 A * 4/1974 Hoffmann et al. ........ 455/236.1
5,625,307 A * 4/1997 Scheinberg ................. 327/113
6,040,731 A * 3/2000 Chen et al. ................. 327/359
6,073,002 A * 6/2000 Peterson .................... 455/326
6,313,688 B1 * 11/2001 Lee et al. ................... 327/359
6,393,266 B1 * 5/2002 Molnar ...................... 455/323
6,437,631 B2 * 8/2002 Amano ...................... 327/359
6,438,365 B1 * 8/2002 Balteanu .................... 455/326

* cited by examiner

Primary Examiner—Timothy P. Callahan
Assistant Examiner—Cassandra Cox
(74) Attorney, Agent, or Firm—Gardner Groff, P.C.

(57) ABSTRACT

The invention is implemented in the form of modifications to a Gilbert mixer circuit. The modifications alleviate disadvantages and problems introduced because of low voltage power supply typically found in low-power devices such as portable cellular phones. In addition to improving the linearity performance, the new design also provides good matching between I and Q signals, and decreases the switching noise in the active mixer by reducing the switching current. The invention can be applied to both single stage and dual mixers to give low noise performance and Automatic Gain Control (AGC).

7 Claims, 7 Drawing Sheets

|  | Conversion Gain (dBv) | Noise Figure (dB) | 1dBc (dBm) | Total Current (mA) |
|---|---|---|---|---|
| 900MHz | 6.1 | 11.5 | -13 | 10.7 |
| 1900MHz | 2.4 | 14.5 | -10 | 10.7 |

FIG. 3

HIGH LINEARITY GILBERT I Q DUAL MIXER

BACKGROUND OF THE INVENTION

The present invention relates generally to communications, and more specifically to modulation and demodulation systems.

As the use of personal wireless radio communications systems, such as digital cellular telephones, operating in frequency bands above 900 MHz, continues to expand there are continuing demands to reduce the overall size and weight of hand-held battery operated terminals. Since much of the bulk and mass of such devices is contributed by a power source, typically a battery pack, reduction in size of the battery pack has a considerable impact on their overall size and weight. The size and mass of the battery pack for a given charge life is dictated largely by the operating voltage and power requirements of the wireless terminal. In order to reduce the size and weight, it is desirable to reduce both the required supply voltage and the power consumption of circuitry used in such devices.

In many communications systems, specifically wireless communications systems, an information signal is modulated onto a higher frequency carrier before being transmitted. In these systems, there is often a need at the receiver end for some form of frequency translation back to lower frequencies. A decision device is then used to recover the information contained in the lower frequency signal. The frequency translation is often performed using frequency mixers. Frequency mixers are important building blocks in transceiver design since the dynamic range and noise/distortion performance of a transmitter/receiver is determined, and often limited, by the first up-down-conversion mixer. There are several types of mixer design used in the industry, probably one of the more popular being the Gilbert mixer.

In a Gilbert mixer an emitter-coupled transistor pair is used to switch the current path between the inner and outer transistors of a collector-cross-coupled coupled quad; this switching creates a double-balanced mixing action. Gilbert mixers differ significantly from diode mixers. The Gilbert cell is an amplifier, so the mixer now has conversion gain rather than the approximately 7 dB loss of a passive mixer. The switching action of the mixer takes relatively little energy to initiate, so although the Integrated Circuit (IC) mixer must be DC biased, its total power budget is often less than that required for a passive mixer driven by a much higher-powered LO. The Gilbert cell is often less sensitive to loading, and doesn't require any bulky transformers, making it an extremely convenient device to use.

The traditional Gilbert mixer has a structure which is based on the application of the well-known cascode structure (also known as a totem pole or tree structure), which, although providing a stable and approximately linear performance, has a disadvantage of requiring a relatively high voltage to operate.

In some situations a dual mixer configuration is used which comprises two pairs of quadrature mixers and a Local Oscillator (LO) power divider thereby yielding two sequential steps of frequency conversion using two separate LO signals. The dual mixer is typically used in image rejection mixers. The quadrature LO required may be generated by any of the methods known to those skilled in the art.

When the components are integrated onto a single integrated circuit (IC) there are several advantages over using discrete components; including: 1) the size and weight of the dual mixer is a fraction of the discrete components combined; 2) interconnections between components are eliminated, which leads to higher performance by eliminating the signal reflections associated with them; 3) by having both mixers in the same housing they will track better over temperature leading to improved performance through better matching; and 4) the price and parts-count of the system are reduced.

Typically, in designing analogue circuits, particularly those implemented in highly integrated technologies, a number of design compromises must be made in the selection of various parameter values, among them conversion gain, local oscillator performance, linearity, noise figure, port-to-port isolation, voltage supply and power consumption. An example of this compromise is found in the design of a 'traditional' Gilbert dual mixer, where the current through the active mixer stages is used to drive the Radio Frequency (RF) amplifier stages. To achieve sufficient linearity in the active mixer stages, the current must be higher than one might wish to achieve a good noise performance in the RF amplifier stages. The design must end up with some compromise in the selection of one or more of these parameters. This type of decision becomes more critical in systems with limited power availability, either because the supply voltage must be lower than in earlier designs, or because the designer is also tasked with providing a circuit with the lowest possible power consumption. These conditions are frequently met in the domain of interest—Personal Communications Systems—which has become dominated by requirements of increased battery life and lower component count and cost, all of which combine to drive the quest for a higher level of integration, despite lower battery voltages.

Other challenges in the design of a 'traditional' Gilbert dual mixer include the reliance in the operation of the device on the close matching of the parameters of the transistors and other active and passive devices used in the generating of the I (In-phase) and Q (Quadrature-phase) signals and the mixing of the RF signal with the LO signal.

With the wide range of competitive modulation mechanisms and pressure on the limited bandwidth in any one frequency band allocated for cellular wireless, especially in North America, there is an increasing demand for multi-mode and multi-frequency designs for the cellular wireless market. The differing requirements on the receiver performance placed on it by the need to deal with frequencies over an octave apart means that it is desirable to vary some performance characteristics as the frequency changes, or even to optimise the power use for a single frequency. One such parameter is the conversion gain. Many existing mixer designs have fixed gain.

As modern Very Large Scale Integration (VLSI) technologies enable higher levels of integration in portable communication applications, high performance radio frequency circuitry is required to meet stringent performance specifications while operating from a low voltage supply. The folded Gilbert cell mixer is an application of current folding that allows Gilbert cell mixing operation at low voltages (below 1.8 volts).

BRIEF SUMMARY OF THE INVENTION

The invention alleviates the aforementioned disadvantages and other disadvantages, and provides the following advantages:

Ability to work at lower voltages

Good matching between I and Q signals.

High linearity.

Decreases the switching noise in the active mixer by reducing the switching current.

Variability of conversion gain.

These advantages are accomplished through the following features taken singly or in suitable combinations:

The combining of 'active' and 'passive' mixers in a single circuit.

The use of single input RF transistors for the I and Q signals.

The injection of a bias current between the RF transistors and their associated mixers to reduce noise in the mixer switches, yet maintain sufficient current in the associated input amplifier circuits for correct operation.

The use of simple resistive elements to fix the active mixer biasing voltages for optimum linearity.

The invention can be applied to both single stage and dual mixers to give low noise performance and Automatic Gain Control (AGC). As devices become more sophisticated, and are able to measure their own performance in real-time, it is becoming practical to optimise their performance, if not during actual use, then at least during some part of the final factory testing. One such parameter is the linearity of the mixer.

For testing purposes, a prototype chip using the invention was designed, simulated, and then fabricated in a standard Silicon high-performance Complementary Metal Oxide Silicon (CMOS) technology process which allows integrated circuits to operate in applications at speeds above approximately 900 MHz.

BRIEF DESCRIPTION OF DRAWINGS

Preferred embodiments of the invention will be described with reference to the following figures:

FIG. 3 is a chart comparing some of the performance parameters for a preferred embodiment of the circuit at 900 MHz and 1900 MHz.

DETAILED DESCRIPTION OF THE INVENTION

Throughout the following descriptions it will be appreciated that the signals, local oscillators, and the various amplifiers and mixers being described operate in 'balanced' or differential mode, generally using a positive-going and complementary negative-going signal (or path as appropriate), not requiring or dependent on any ground reference. Although, for typical implementations, the local oscillator signals comprise a pair of sinusoidal signals bearing a quadrature relationship to one another, other types of the local oscillator signals are possible, as will be appreciated by those skilled in the art.

We will now describe a preferred embodiment of the invention with reference to a prior art implementation, first by describing the prior art, then describing the modifications to the circuit to implement the preferred embodiment. Finally, to further illustrate the flexibility of the invention, we include descriptions of other preferred embodiments.

Note that, for the sake of clarity, in the figures and their descriptions following, any supplementary, subsidiary, and parasitic components which are not concerned with the operation of the invention are omitted.

Figure 1:
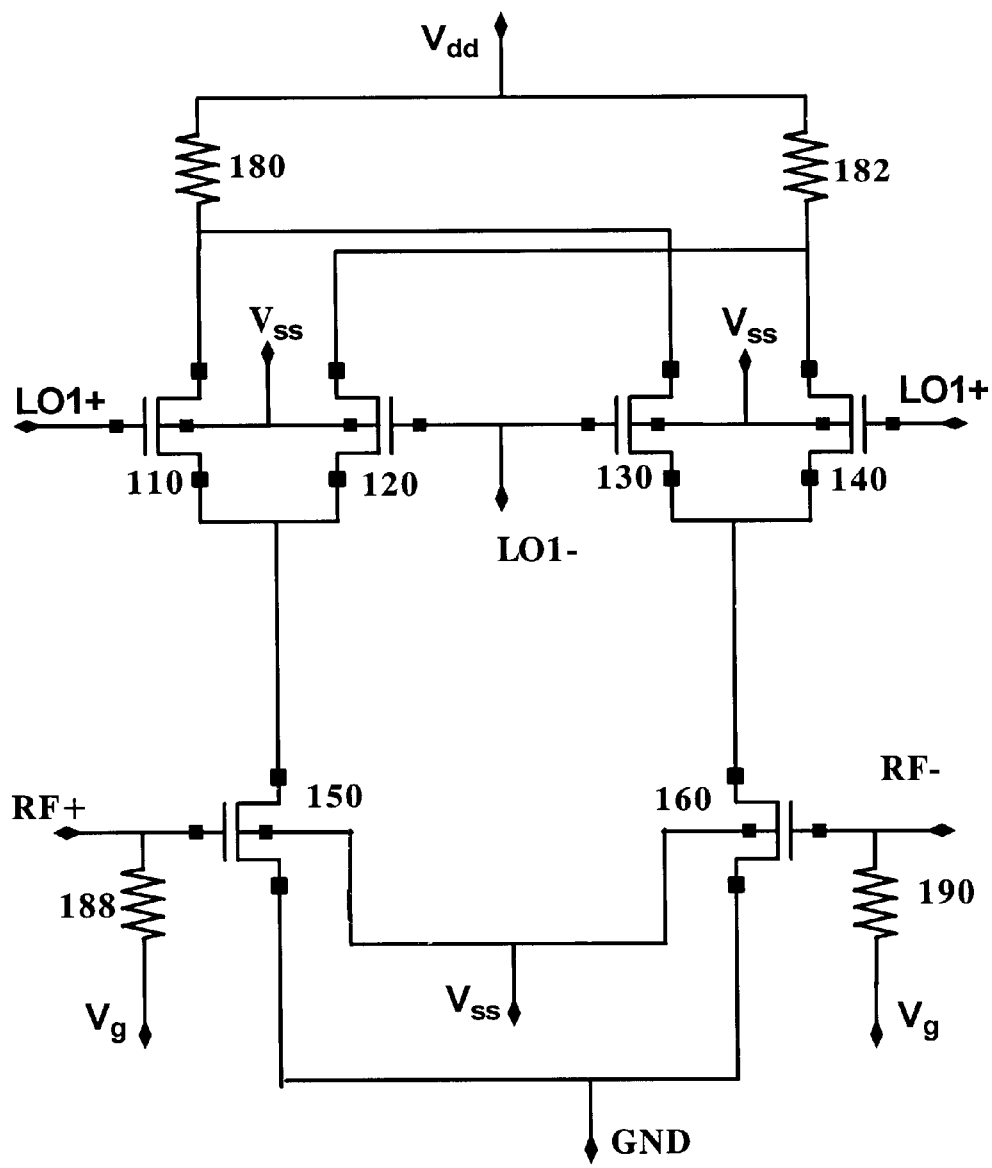
FIG. 1 shows a prior art implementation of a Gilbert mixer circuit.

FIG. 1 illustrates a prior art traditional Gilbert cell multiplier or mixer circuit. As shown in FIG. 1, the circuit receives a differential voltage, RF+, RF−, as the radio frequency (RF) input signal, and a differential voltage, LO1+, LO1−, as the local oscillator (LO) signal. The differential output voltage appears between the load resistors 180, 182 in the active mixer portion of the circuit. The load resistors 180 and 182 have the same value. The circuit includes a number of Field Effect Transistors (FET) transistors, 110, 120, 130, 140, 150, and 160 which are normally biased to operate in the high gain saturation region. The RF+ signal is applied to the gate of transistor 150, and the RF− signal is applied to the gate of transistor 160, these transistors 150, 160 being coupled as a differential pair, their sources being coupled together to ground, labelled GND. The sources of transistors 110 and 120 are coupled together as a differential pair whose common connection is coupled to the drain of transistor 150. Similarly, the sources of transistors 130 and 140 are coupled together as a differential pair whose common connection is coupled to the drain of transistor 160. The gates of transistors 110 and 140 are controlled by the LO+ signal, and the gates of transistors 120 and 130 are controlled by the LO− signal. The conversion gain of the multiplier is increased as the value of the load resistors 180, 182 is increased. However, the value of the load resistors cannot merely be increased arbitrarily to any value because an increase in the resistance causes a significant DC voltage drop at the top of the cell. If only a small voltage remains at the drain of transistors 110,120,130 and 140, then there is insufficient voltage available to power the RF amplifier part of the circuit, transistors 150,160. In particular, for applications where the power supply is typically set at approximately 2.7 volts to 3 volts, the drop in voltage due to large resistive values of 180 and 182 is unacceptable.

Preferred embodiments of the invention are implemented as a modifications to a Gilbert mixer circuit to alleviate the disadvantages and problems introduced because of low voltage power supply typically found in low-power devices such as portable cellular phones. Generally, in these circumstances, the use of an active mixer results in poor linearity when using prior art designs.

Figure 2:
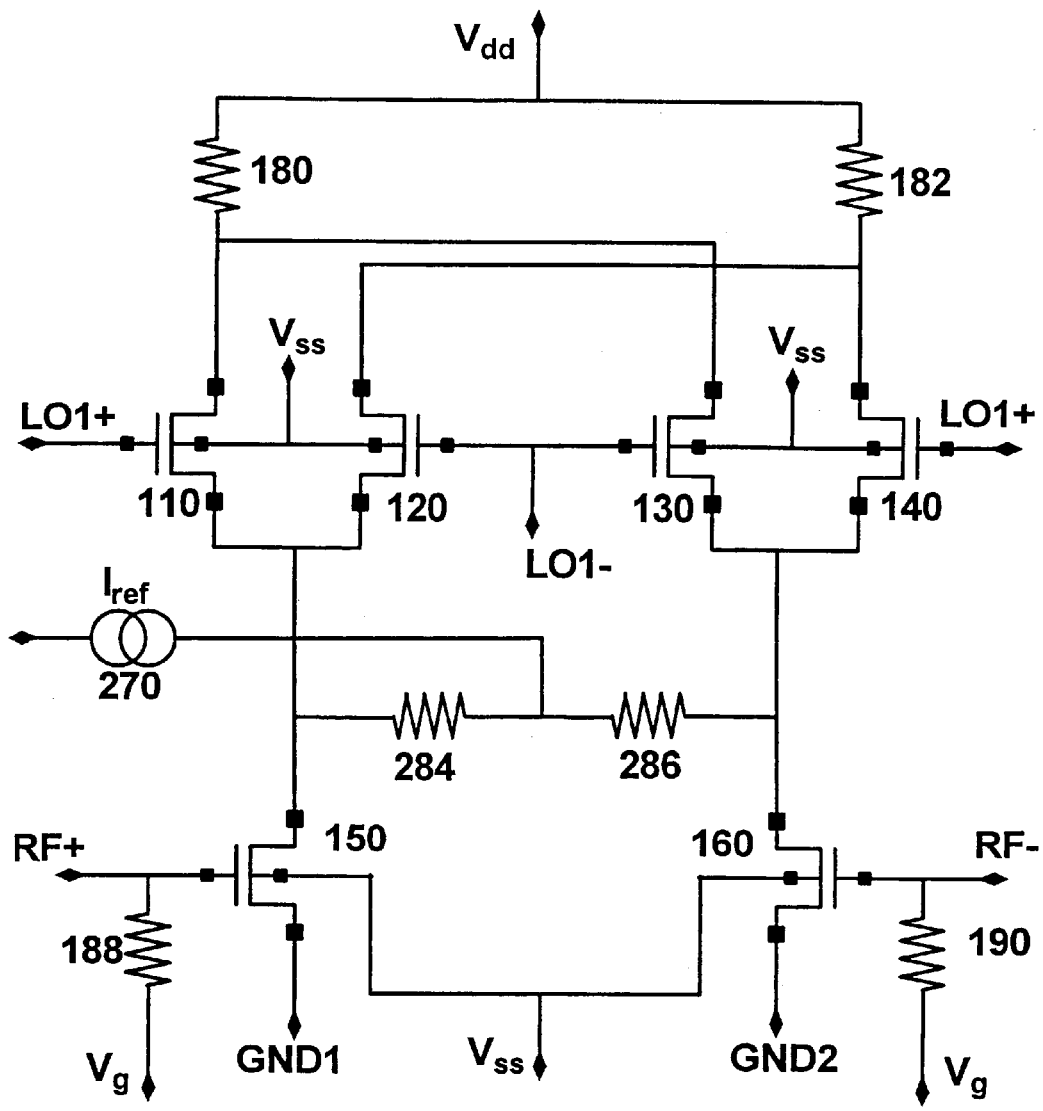
FIG. 2 shows a Gilbert mixer incorporating a preferred embodiment of the invention.

A preferred embodiment of the invention is next described with reference to a Gilbert mixer circuit as shown in FIG. 2. In this figure, the components labelled 110 to 190 perform the same functions as in FIG. 1. The extra components are next described in detail, with particular reference to their effect on the operation of the Gilbert mixer circuit. In the invention, a current injection circuit is introduced comprising a constant current source 270 and two resistors 284 and 286. This current injection circuit is arranged to provide the majority of current required by the RF amplifier transistors thereby requiring the active mixer switches to provide only a small proportion of the current required for the RF amplifier stage. As will be appreciated by those skilled in the art, the reduced contribution of current to the RF amplifier circuit, results in less noise being referred to the inputs of the active mixer input transistors and also less noise being generated by the resistive load of the active mixer circuit, resulting in improved overall noise performance. At the same time, the total current flowing through the RF amplifier transistors can be maintained at a level sufficient to ensure their operation at the required gain and linearity as further discussed below.

The resistors 284, 286 forming part of the current injection source also affect the gain of the input transistors 150, 160 which form the RF amplifier or input stage of the mixer. As will be appreciated by those skilled in the art, decreasing the value of these resistors 284, 286 reduces the conversion gain of the overall mixer circuit. Similarly, increasing the value of the resistors increases the conversion gain. The value of the resistors 284, 286 must therefore be chosen with care to provide acceptable overall noise performance and overall conversion gain.

The linearity of an active mixer is dependent on the biasing voltage of transistors. A simple voltage divider is used as the load of mixer. There are at least two sources of non-linearity: First the non-linearity of the RF transistors and second that of the switching transistors. The optimum biasing must be found through simulation or other techniques. The bias voltage applied to each of the drains of the active mixer switches is thereby selected and fixed to that necessary for optimum linearity during design.

FIG. 3 is table showing the predicted performance parameters for a typical implementation using one preferred embodiment of the invention (Note: IIP3—third-order Input Intercept Point-the theoretical input level at which the third-order two-tone distortion products are equal in power to the desired signals.) These figures are comparable to a more 'traditional design', but are achieved with lower voltage supply line in the preferred embodiment. Normal IC layout and design considerations for the technology must be taken in account during implementation of the invention.

Figure 4:
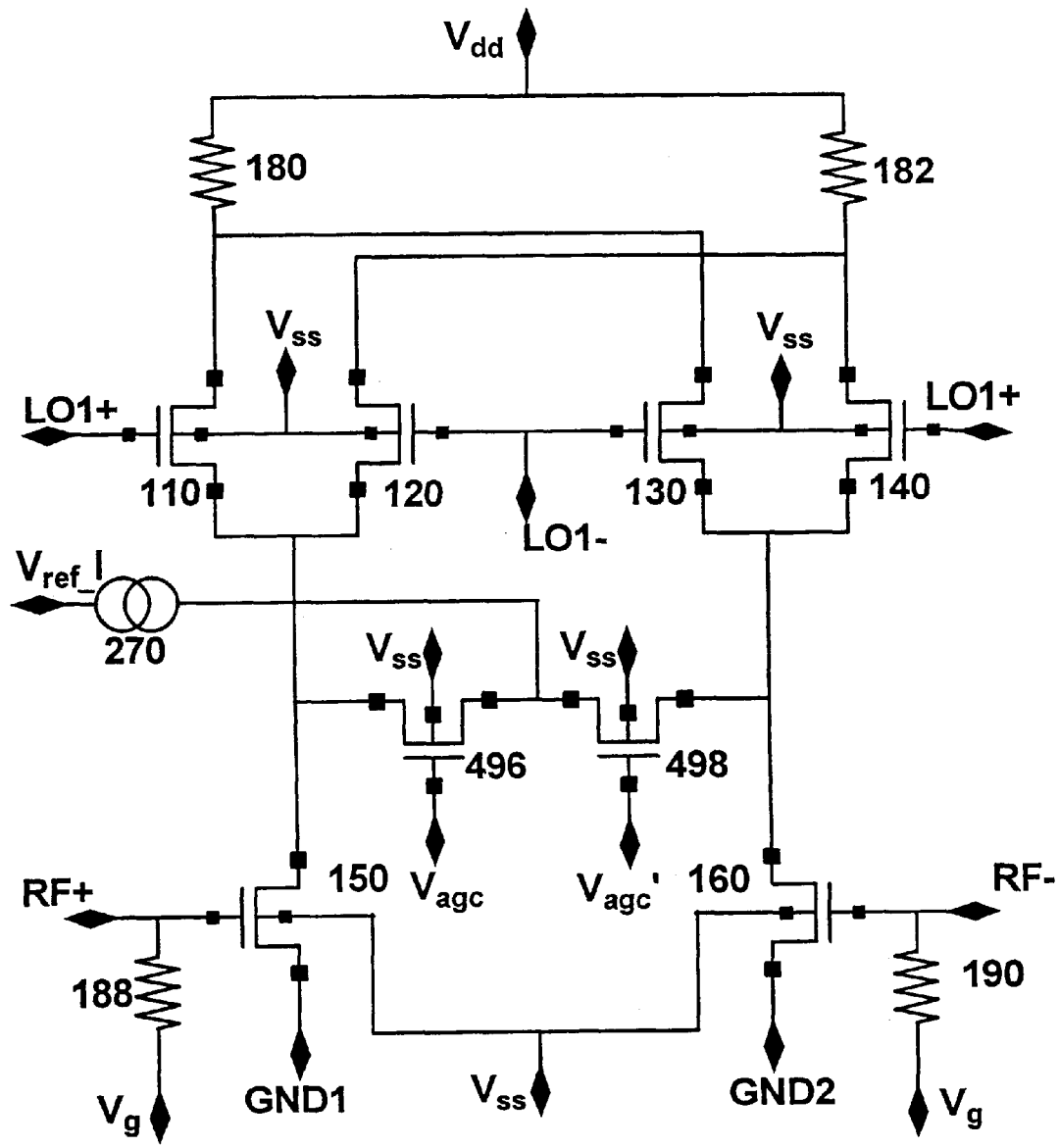
FIG. 4 shows a further preferred embodiment of the invention in the context of a dual mixer.

The FIG. 4 shows a further preferred embodiment of the invention in which resistors which form part of the current injection source feeding the RF amplifier circuit are replaced by a pair of transistors 496, 498 acting as variable resistors. Again, in this figure, the components labelled 110 to 190 perform the same functions as in FIG. 1. By varying the gate bias voltages $V_{agc}$, $V_{agc}'$ of the transistors 496, 498, the resistance of the transistors change and therefore the conversion gain is varied. As would be appreciated by one skilled in the art, this can be used as part of an AGC circuit for mixer. This preferred embodiment allows a designer the additional freedom of permitting changes in gain, noise performance, etc. of various elements of the dual mixer device, either during the manufacturing assembly process, or after silicon has been manufactured and encapsulated. In some embodiments these parameters are altered during a actual usage, for example, in reaction to varying reception conditions.

Referring now to FIGS. 5a, 5b, 5c, 5d, 5e and 5f which together show a more complex preferred embodiment of the invention which incorporates both active and passive mixers. This arrangement is for use in a system employing dual local oscillators for conversion, but the invention in equally suitable for any application requiring one or more mixing stages.

Figure 5A:
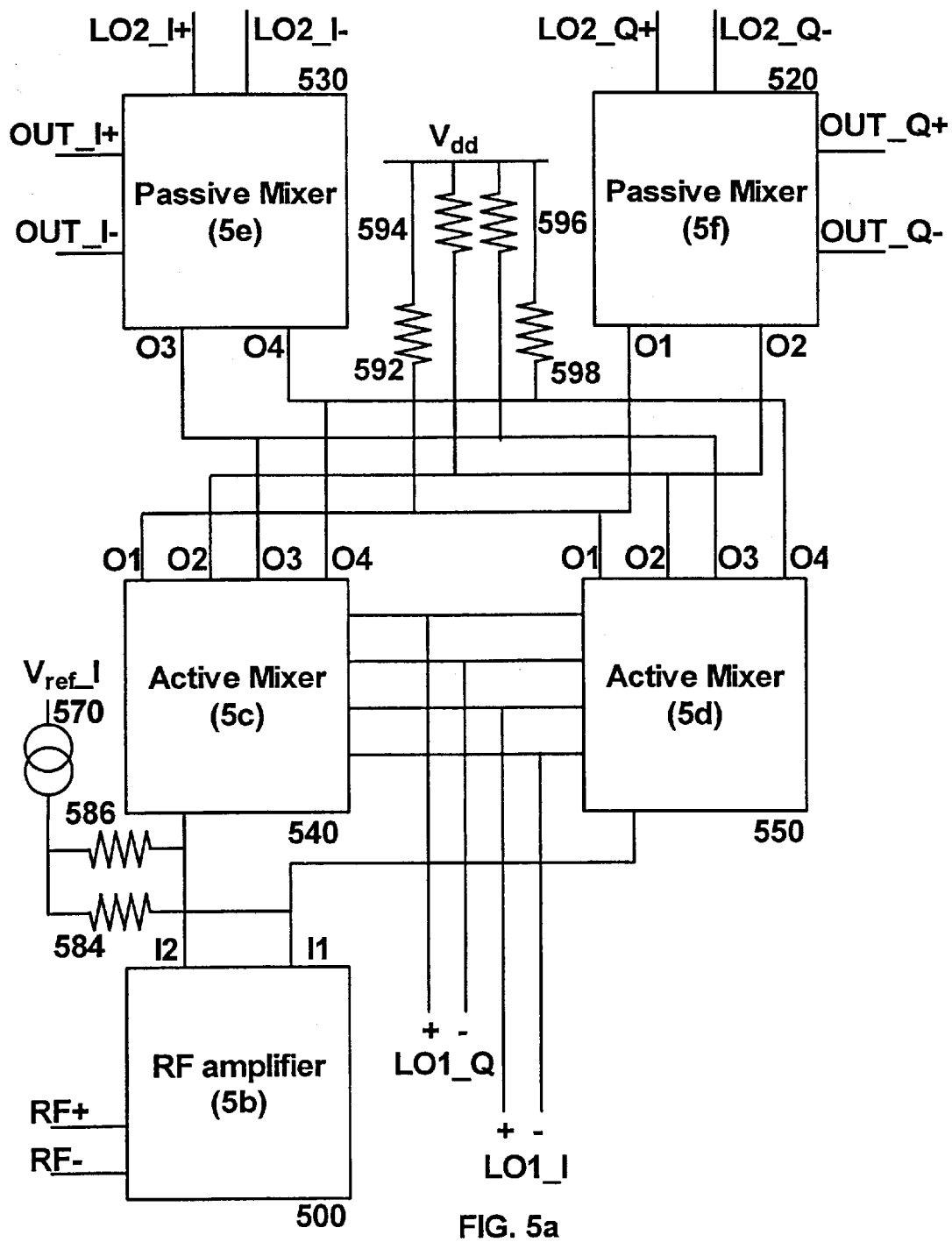
FIGS. 5a, 5b, 5c, 5d, 5e, and 5f, taken together, show a further preferred embodiment of the invention.

FIG. 5a shows the main elements or stages of the circuit, which are the input RF amplifier (5b) 500, active mixers (5c) and (5d)540, 550, in the form of switches driven from a first local oscillator LO1_I+, LO1_I−, LO1_Q+, LO1_Q−, and passive mixers (5e)and (5f)530, 520 driven from a second local oscillator LO2_I+, LO2_13 I−, LO2_Q+, LO2_Q−. Each element or stage 500, 520, 530, 540, 550 shown in FIG. 5a is expanded to show more detail in the FIGS. 5b, 5c, 5d, 5e, and 5f. Each of the following descriptions of the figures also refer to FIG. 5a.

Figure 5B:
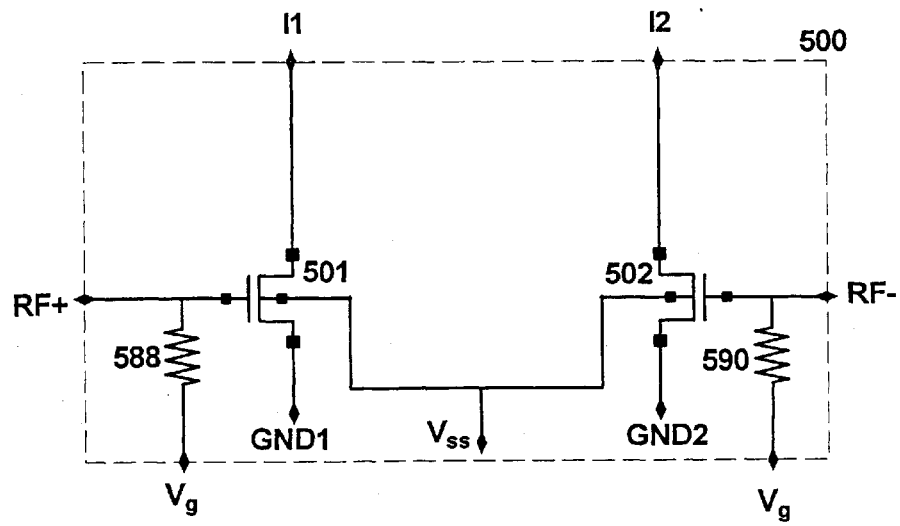

Turning now to FIG. 5b illustrating the RF amplifier stage in which the incoming signal is amplified by transistors 501, 502 before being presented to the active mixers 520, 530. The current required to permit this stage to operate efficiently is provided largely by the current injection circuit shown in FIG. 5a comprised of a constant current source 570, and resistors 584 and 586. Some part of the current is also provided by the active mixer stages (5c)540, and (5d)520. The magnitude of this current, and the values of the resistors 588 and 590 which bias gates of transistors 501, 502, are selected so that the transistors are working in their linear region with optimised gain and noise performance. To achieve a higher conversion gain and a lower noise figure more current is required to flow through these transistors, or the value of the load resistors might be increased. The transistors 501, 502 must have matched parameters. The matching of these parameters is most preferably achieved by ensuring the devices are the same physical size and layout, and that they are positioned near each other on the semiconductor (substrate). It will be appreciated by one skilled in the art that mirror images and other simple translations of topography will not significantly affect the similarity of layout. In addition to their role in controlling the injection current, resistors 584, 586 control the gain of the RF amplifier stages. Resistors 584, 586 may be adjustable in the factory using laser trimming or another suitable technology. In a further embodiment resistors 584, 586 are replaced by transistors and are field adjustable, indirectly by some form of manual control, or automatically by being driven from some derived measurement of the performance of the overall circuit.

Figure 5C:
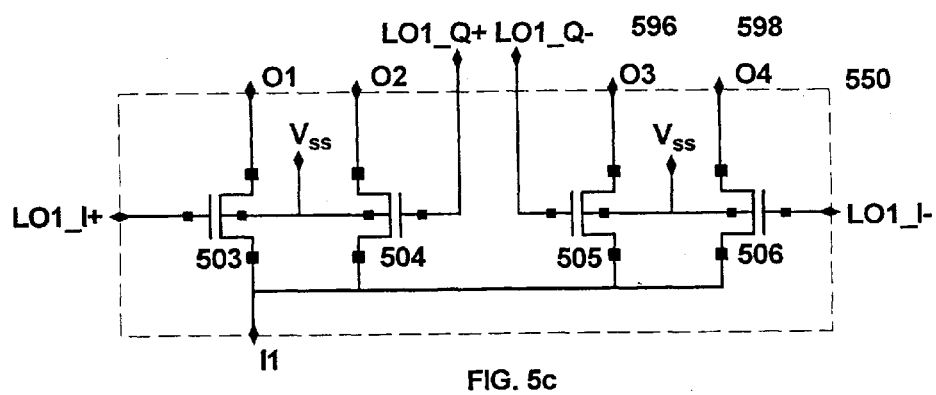
Figure 5D:
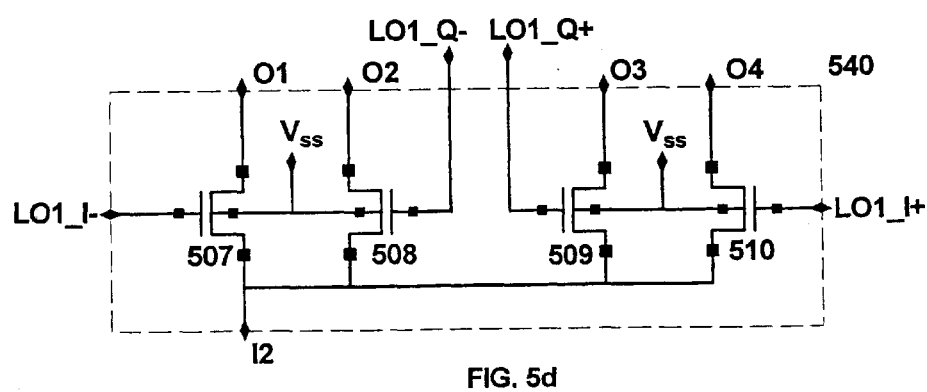

Turning next to FIGS. 5c and 5d, illustrating the near identical active mixers. Each of these circuits comprises four transistors acting as switches 503, 504, 505, and 506, and 507, 508, 509, and 510, respectively, arranged so that the incoming amplified RF signals 11 and 12 are selectively coupled to the outputs O1, O2, O3 and O4 according to the local oscillator inputs LO1_Q and LO1_I, thereby multiplying or mixing the LO with the incoming RF signal to produce intermediate frequencies (or in the case of homodyne systems, baseband signals) in quadrature for passing to the next stage of the circuit. The drains of each of the transistors are connected together for each mixer, and provide that fraction of the source current for the RF amplifier not provided by the current injection circuit 570, 584, 586 described earlier. Each of the switches 503, 504, 505, 506, 507, 508, 509, 510 for first local oscillator must be matched for gain and other parameters to ensure suitable performance characteristics. The current through the switches 503, 504, 505, 506, 507, 508, 509, 510 must also be selected carefully. If it is too low the conversion gain is reduced but if it is too high the noise figure increases. The ratio of current passing through the switches to that passing through the RF transistors must be adjusted for each design to arrive at the required compromise of gain and noise performance. It has been found that a ratio of approximately 1/25 is a good design starting point.

The voltage ($V_d$) applied to the drain of switches 503, 504, 505, 506, 507, 508, 509, 510 is somewhat critical. If it is too high the passive mixer cannot work properly. The following conditions should both be met:

$$V_{on} - V_d > V_{th} \text{ and } V_{off} - V_d < V_{th}$$

Where $V_{on}$ and $V_{off}$ are the voltage levels applied to the gates of passive mixer switches to turn them on and off respectively.

Figure 5E:
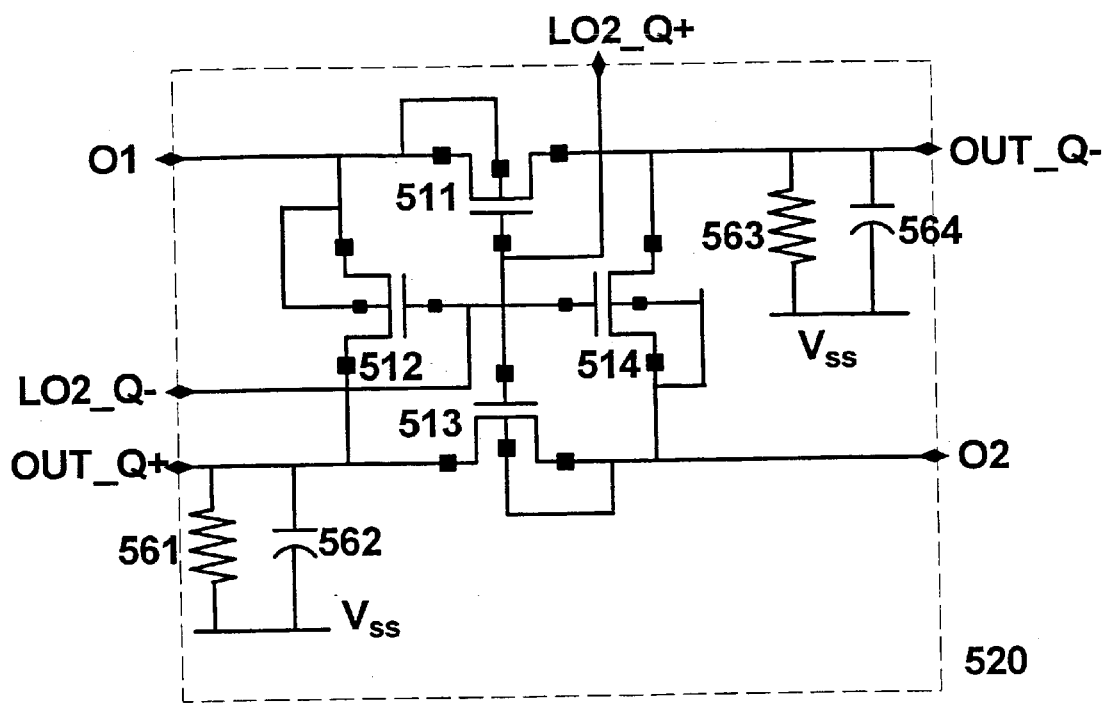
Figure 5F:
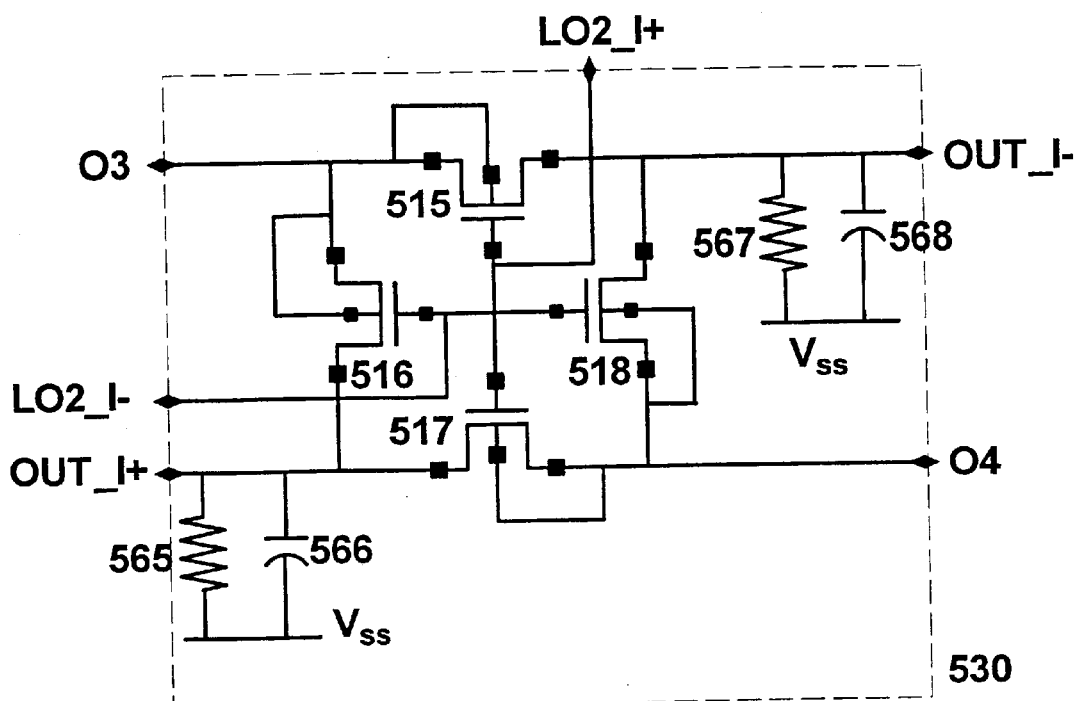

The outputs O1, O2, O3 and O4 of the dual active mixers are then passed to a further pair of passive mixers 530, 520 shown in detail in FIGS. 5e and 5f, to which we now turn. Each figure shows near identical passive mixers, in which transistors 511, 512, 513 and 514, and 515, 516, 517 and 518, are connected as diodes in a well-known passive mixer format. A second local oscillator frequency LO2_Q and LO2_I is then mixed with the components generated by the active mixers to produce the final output of the mixer stages OUT_Q and OUT_I respectively. Capacitors 562, 564, 566, 568 act as low-pass filters to remove local oscillator and carrier frequencies. Each of the I and Q passive switches 511, 512, 513, 514, 515, 516, 517, 518 for the second local oscillator must be matched for gain.

The various pairs of resistors 592 with 565, 594 with 567, 596 with 561, and 598 with 563, act as voltage dividers for fixing the DC biasing of their respective mixer transistors, and thereby affect the linearity of mixer performance. The selection of the ratio of each pair of voltage divider resistors values (e.g. 565 and 592) must be accompanied by the consideration of their combined series resistance, since they can have same ratio with different values. If the combined series resistance is set too high in order to achieve a higher overall conversion gain then the noise figure of mixers is increased, and vice versa. Each design decision depends on the overall system requirements, and the values must be selected accordingly.

It is important that the operating parameters of the RF transistors for the I and Q switches are closely matched, and care must be taken in their physical design and layout to ensure this is achieved.

It has been observed that the combination of active and passive mixers increases the overall linearity of the sub-system when compared to a design using stacked active mixers. This is unsurprising since this design results in reduced voltage headroom requirements for the two mixer stages.

The values of the gain-controlling resistors 584, 586 can be adjusted to vary the overall conversion gain of the mixer performance during the final stages of manufacture. In another preferred embodiment, the gain-controlling resistors are replaced by gain-controlling transistors. Monitoring of signal strength allows the system to provide Automatic Gain Control (AGC), as reception conditions vary by applying an appropriate signal to the gates of the gain-controlling transistors. Thus, with suitable measurement or monitoring, the manufacturer during the manufacturing process, or the wireless terminal itself during operation is able to vary a number of interacting parameters and select the most applicable compromise available to it.

It will be apparent to one skilled in the art that the same inventive concepts can be used in an up-converting mixer of a transmitting system, as well as being applied to other mixer designs having similar characteristics and requirements to those described herein.

What is claimed is:

1. A modified Gilbert mixer circuit for use in radio transmitters and receivers in the translation of known input frequencies to known output frequencies, comprising:

an RF amplifier stage, comprising two transistors arranged to amplify a balanced RF input signal;

a pair of active balanced mixers;

the RF amplifier stage and the active balanced mixers in a totem pole arrangement; and a current injection circuit comprising a constant current source and two gain-controlling resistors, each resistor arranged to feed current to the source of one transistor of the RF amplifier stage, thereby reducing the current supplied by the active mixers to the RF amplifier transistors, thereby improving the noise performance of the mixers without unnecessarily compromising the gain and linearity performance of the RF amplifier.

2. A modified Gilbert mixer circuit for use in radio transmitters and receivers in the translation of known input frequencies to known output frequencies, comprising:

an RF amplifier stage, comprising two transistors arranged to amplify a balanced RF input signal;

a pair of active balanced mixers;

the RF amplifier stage and the active balanced mixers in a totem pole arrangement; and a current injection circuit comprising a constant current source and two gain-controlling transistors, each transistor arranged to feed current to the source of one transistor of the RF amplifier stage, thereby reducing the current supplied by the active mixers to the RF amplifier transistors, thereby improving the noise performance of the mixers without unnecessarily compromising the gain and linearity performance of the RF amplifier, and by varying the bias of the gate of the gain-controlling transistors permitting variation in the gain of the RF amplifier circuit for use in an Automatic Gain Control system, and also permitting adjustment of the gain and linearity of the RF amplifier circuit during and after manufacture.

3. A computer readable memory medium, storing computer software code in a hardware development language for fabrication of an integrated circuit comprising the modified Gilbert dual mixer circuit of claim 2.

4. A modified Gilbert dual mixer circuit comprising:

a dual mixer, further comprising an RF amplifier stage, a pair of active balanced mixers, and a pair of passive balanced mixers, each pair of mixers being driven by separate but related local oscillator signals, arranged so that signals introduced into the RF amplifier stage pass in turn to the active mixers and then to the passive mixers, thereby permitting frequency translation by mixing the input signal with two separate waveforms defined by the two local oscillator signals; and a current injection circuit comprising a constant current source and two gain-controlling resistors arranged to provide extra current to an RF amplifier transistor stage within the dual mixer, thereby reducing the current required to be supplied by the active and passive mixers driven therefrom, and also thereby reducing the noise induced in the active and passive mixers, and also thereby ensuring sufficient current passes through the RF amplifier transistor stage to provide adequate gain and noise performance.

5. A computer readable memory medium, storing computer software code in a hardware development language for fabrication of an integrated circuit comprising the modified Gilbert dual mixer circuit of claim 4.

6. A modified Gilbert dual mixer circuit comprising:

a dual mixer, further comprising an RF amplifier stage, a pair of active balanced mixers, and a pair of passive balanced mixers, each pair of mixers being driven by separate but related local oscillator signals, arranged so that signals introduced into the RF amplifier stage pass in turn to the active mixers and then to the passive mixers, thereby permitting frequency translation by mixing the input signal with two separate waveforms defined by the two local oscillator signals; and a current injection circuit comprising a constant current source and two gain-controlling transistors arranged to provide extra current to the sources of an RF amplifier transistor stage within the dual mixer, thereby reducing the current required to be supplied by the active and passive mixers driven therefrom, and also thereby reducing the noise induced in the active and passive mixers, and also thereby ensuring sufficient current passes through the RF amplifier transistor stage to provide adequate gain and noise performance, the gain-controlling transistors permitting variation in the gain of the RF amplifier circuit for use in an Automatic Gain Control system, and also permitting adjustment of the gain and linearity of the RF amplifier circuit during and after manufacture.

7. A computer readable memory medium, storing computer software code in a hardware development language for fabrication of an integrated circuit comprising the modified Gilbert dual mixer circuit of claim 6.

* * * * *